United States Patent [19]

Amery et al.

[11] 4,385,326
[45] May 24, 1983

[54] VIDEO DISC SYSTEMS WITH PLURAL PREEMPHASIS/DEEMPHASIS NETWORKS

[75] Inventors: John G. Amery, Danville; James H. Wharton, Indianapolis, both of Ind.

[73] Assignee: RCA Corporation, New York, N.Y.

[21] Appl. No.: 206,945

[22] Filed: Nov. 14, 1980

Related U.S. Application Data

[63] Continuation-in-part of Ser. No. 163,275, Jun. 26, 1980, abandoned.

[51] Int. Cl.³ .................... H04N 9/491; H04N 5/14
[52] U.S. Cl. ........................................ 358/315; 358/39
[58] Field of Search .............. 358/4, 8, 31, 37, 38, 358/39, 27, 310, 315, 327, 329

[56] References Cited

U.S. PATENT DOCUMENTS

| | | | |
|---|---|---|---|
| 3,934,263 | 1/1976 | Palmer | 358/4 |
| 4,005,474 | 1/1977 | Keizer | 358/4 |
| 4,007,483 | 2/1977 | van Cang | 358/4 |
| 4,022,968 | 5/1977 | Keizer | 358/128 |
| 4,057,826 | 11/1977 | Baker | 358/4 |
| 4,096,513 | 6/1978 | Ross | 358/4 |
| 4,316,210 | 2/1982 | Wharton | 358/39 X |
| 4,316,213 | 2/1982 | Wharton et al. | 358/4 X |

OTHER PUBLICATIONS

W. E. Thompson, "The Synthesis of a Network to Have a Sine-Squared Impulse Response", Proc. IEE (London), vol. 99, 1973, pp. 373-376.
A. Kastelein, "A New Sine-Squared Pulse and Bar Shaping Network", IEEE Transaction on Broadcasting, vol. BC-16, No. 4, pp. 84-89.
H. E. Ennes, "Television Broadcasting, Equipment, Systems, and Operating Fundamentals", Second Edition, 1979, p. 227.

*Primary Examiner*—Aristotelis M. Psitos
*Attorney, Agent, or Firm*—E. M. Whitacre; J. S. Tripoli; R. G. Coalter

[57] ABSTRACT

In video recording apparatus a luminance signal is doubly preemphasized by a cascade connection of two networks prior to clipping and application to a frequency modulator. One network has a non-linear phase characteristic and an amplitude response which increases by a predetermined amount over a lower portion of the luminance band and is substantially constant otherwise. The other network has a substantially linear phase response, and a rising amplitude response within the upper portion of the luminance band. The relative amplitude responses of the networks are in a predetermined relationship such that the combination exhibits a frequency dependent variation dominated by the one network over the lower portion of the luminance band and dominated by the other network over the upper portion of the luminance band whereby the luminance signal receives an increase in preemphasis over both portions of its bandwidth and clipping distortion under transient signal conditions is reduced. In video reproducer apparatus, a combination of deemphasis networks imparts a complementary deemphasis characteristic to the preemphasized luminance signal thereby effecting a signal-to-noise ratio enhancement.

15 Claims, 9 Drawing Figures

VIDEO DISC SYSTEMS WITH PLURAL PREEMPHASIS/DEEMPHASIS NETWORKS

This application is a continuation-in-part of U.S. Pat. application Ser. No. 163275 filed June 26, 1980 now abandoned.

This invention relates to video signal processing apparatus and particularly to apparatus for forming a modulating signal for a picture carrier frequency modulator in systems, such as video disc or tape recording systems, that employ FM techniques in the translation of color picture information.

In certain color picture information processing systems it is advantageous to employ FM techniques in the translation of video information. See, for example, U.S. Pat. Nos. 3,934,263; 4,022,968; and 4,005,474 which disclose video disc recording arrangements in which a recording signal is formed which includes a picture carrier wave modulated in frequency in accordance with the amplitude of a composite color video signal inclusive of luminance and chrominance components.

In such video disc (or tape) recording systems, bandwidth limitations of the recording media can limit the modulation index for the higher frequency components of the video signal to such an extent that a signal-to-noise ratio loss may occur for signal frequency components near the higher end of the modulating signal bandwidth. Illustratively, the loss for a 3 MHz video signal component in a FM system having a peak deviation of 1 MHz (i.e., Narrow Band Frequency Modulation, NBFM) is on the order of 4.8 dB. For lower frequency signal components the effective modulation index is higher and therefore the loss decreases with frequency. For signal components having an effective modulation index above 0.6 a signal-to-noise ratio gain results. For this reason, it is conventional practice in disc and tape recording systems to translate the chrominance signal from its normal location at the upper end of the luminance band to a lower frequency so that the chrominance component does not suffer a signal-to-noise ratio loss. Pritchard, in U.S. Pat. No. 3,872,498 discloses translating systems which interleave or "bury" chrominance signal within the midband portion of the luminance signal. This is commonly referred to as "buried subcarrier" encoding and prevents degradation of the chrominance signal-to-noise ratio for the reasons mentioned above.

While the chrominance signal-to-noise ratio may be preserved (or improved) by means of buried subcarrier encoding, a different approach is required to overcome the loss which occurs for higher frequency luminance components. Conventionally, the luminance signal is subjected to high frequency preemphasis prior to modulation of the FM carrier so that a signal-to-noise ratio improvement may be realized when a complementary high frequency deemphasis is imparted to the luminance component subsequent to demodulation of the FM carrier (e.g., in a disc or tape player).

One problem in obtaining a signal-to-noise ratio improvement of the luminance signal by means of preemphasis is that the video system dynamic range may be exceeded for short intervals, especially during abrupt signal changes. For example, on step transistions of the luminance signal, preemphasis of the higher frequencies may result in large overshoots of the signal. The effect of such a condition in video disc mastering, if not compensated for, could be to cause the mastering cutterhead dynamic range to be exceeded and, this in turn, can lead to replication difficulties as well as result in spurious signal effects (e.g., intermodulation distortion, beats, crosstalk, etc.) upon playback of the disc.

To avoid the problem of overshoots (which leads to excessive FM carrier deviation) the preemphasized luminance signal is commonly clipped at predetermined levels prior to application to the picture carrier frequency modulator so that the clipping levels of the clipping circuit set precise boundaries for the picture carrier deviation range within a frequency region compatible with the recording system capabilities. In video disc mastering applications this substantially minimizes the aforementioned problem by preventing excessive excursions of the mastering cutterhead.

Although clipping advantageously prevents overmodulation of an FM carrier by a preemphasized luminance signal, it nevertheless is a non-linear process and results in loss of the information content of the clipped portion of the signal and introduces distortion. Because of these undesirable effects, there are practical limitations on the amount of preemphasis which may be imparted to the luminance signal before the undesirable effects of clipping outweigh the signal-to-noise ratio improvement provided by the preemphasis and subsequent deemphasis.

As an example, in video signal processing apparatus proposed by M. D. Ross in U.S. Pat. No. 4,096,513 the luminance signal is preemphasized by approximately 12 dB (i.e., a factor of four in terms of voltage or 16 in terms of power), clipped, summed with a chrominance signal and then the composite signal is clipped. For the reasons discussed in detail in the Ross patent, double clipping advantageously avoids the problem of serration of vertical edges of a picture which can otherwise occur in conventional systems where only the composite video signal is clipped.

In the Ross system, the luminance bandwidth is about 3 MHz and the preemphasis circuit comprises a resistance-capacitance (RC) network which provides phase lead at a frequency of about 0.25 MHz and phase lag at a frequency of about 1.0 MHz. The slope of the lead-lag network between break points is 6 dB per octave and since the break points are spaced two octaves apart the net high frequency boost is, therefore, about 12 dB. Above the upper breakpoint (1.0 MHz) the slope of the network transfer function reduces to zero so that the preemphasis remains substantially constant at about 12 dB over the upper portion of the luminance frequency band (e.g., 1–3 MHz).

It would be desirable for improved signal-to-noise ratio performance to provide additional preemphasis to the luminance signal over that proposed by Ross. To do this, one might consider simply moving the lag breakpoint of the Ross network to a higher frequency or moving the lead breakpoint to a lower frequency so that the preemphasis transition region extends over more than two octaves. Neither approach, however, is satisfactory because of the aforementioned problem of clipping which, although necessary to prevent overmodulation of the FM signal, introduces distortion that is particularly troublesome under transient signal conditions where the luminance signal contains substantial amounts of high frequency energy.

Yet another problem with the conventional preemphasis technique is that the resultant constant high frequency boost in the upper portion of the luminance band (e.g., 1–3 MHz or so) causes peaking of the luminance signal-to-noise ratio at a point lower in frequency than the edge of the luminance band. This necessarily results because with or without preemphasis the effective modulation index varies inversely with the frequency components of the signal as previously mentioned. In other words, in the example under consideration, the 12 dB of preemphasis does not result in a 12 dB signal-to-noise ratio gain at an assumed band edge of 3 MHz since the loss due to narrow band FM transmission increases to 4.8 dB at 3 MHz. Thus, when one considers the entire transmission system including deemphasis provided by the reproducer (tape or disc player) the luminance signal exhibits a signal-to-noise ratio which decreases, to a certain extent, at band edge. For a detailed discussion of the variation of signal-to-noise ratio as a function of modulation index for wide and narrow band FM systems, see for example, Hancock, "An Introduction To The Principles of Communication Theory" published by the McGrawHill Book Company, Inc., 1961, chapter 2.

The present invention is directed to meeting the need for a video signal processing apparatus having an improved luminance signal-to-noise ratio characteristic and in which clipping distortion under transient signal conditions is reduced.

The principles of the invention may advantageously be applied to video signal processing apparatus of the type wherein carrier frequency waves are subject to frequency modulation by a luminance signal and which includes a preemphasis network for subjecting the luminance signal to high frequency preemphasis and signal clipping means for confining the preemphasized luminance signal excursions to a selected range of values. The preemphasis network is of a type having a non-linear phase characteristic and an amplitude response characteristic which increases by a predetermined amount over a lower portion of the luminance signal frequency band and assumes a substantially constant level over an upper portion of the luminance signal frequency band.

In accordance with a first aspect of the invention, a system of the type described may be improved by the addition of a second preemphasis network having an amplitude response which increases throughout the upper portion of the luminance signal frequency band. The second preemphasis network is of a type exhibiting a substantially linear phase characteristic. Circuit means are provided for coupling the two preemphasis networks in a cascade connection for doubly preemphasizing the luminance signal prior to application thereof to the signal clipping means. The relative amplitude response characteristics of the two preemphasis networks are selected in a predetermined relationship such that the amplitude response of the cascade connection exhibits a frequency dependent variation dominated by the first mentioned network over the lower portion of the luminance band and dominated by the second network over the upper portion of the luminance band, whereby the luminance signal receives an increase in preemphasis over both portions of its bandwidth and clipping distortion under transient signal conditions is reduced.

A further object of the invention is to provide apparatus for imparting a deemphasis characteristic to a luminance signal which is essentially complementary to the hereinbefore described preemphasis characteristic. A video disc player, embodying this aspect of the invention, comprises turntable means for rotating a record having a video signal recorded thereon, signal recovery means for recovering the video signal from the record and a pair of deemphasis networks. A first one of the networks is of a type having a non-linear phase characteristic and an amplitude response characteristic which decreases by a predetermined amount over a lower portion of the video signal frequency band and assumes a substantially constant level over an upper portion of the video signal frequency band. A second one of the networks is of a type having an amplitude response characteristic which decreases throughout the upper portion of the video signal frequency band and having a substantially linear phase characteristic. Means are provided for coupling the first and second deemphasis network means to form a circuit path for doubly deemphasizing the video signal. The relative amplitude response characteristics of the first and second network means are selected in a predetermined relationship such that the amplitude response of the circuit path exhibits a frequency dependent variation dominated by the first network means over the lower portion of the video signal frequency band and dominated by the second network means over the upper portion of the video signal frequency band. A modulator means is coupled to the circuit path and is responsive to the doubly deemphasized video signal for producing a modulated carrier wave output signal for application to a television receiver.

The above and further features of the invention are presented in detail in the following description and illustrated in the accompanying drawings where like references designators denote like elements and in which.

Figure 1:
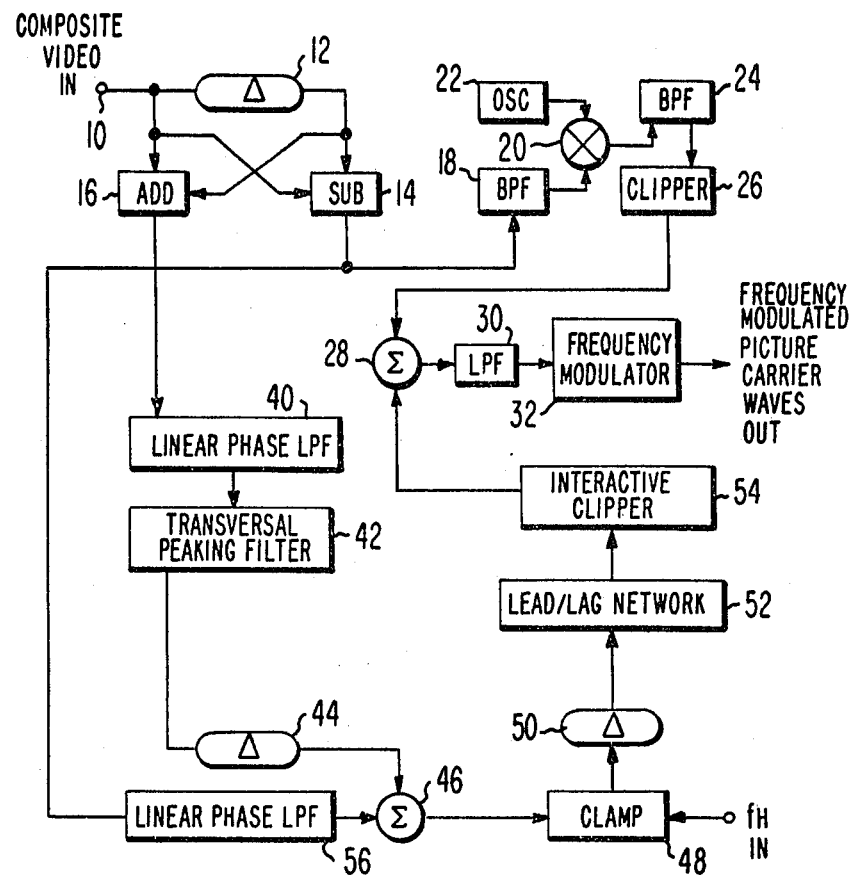
FIG. 1 is a block diagram of a video signal processing apparatus embodying the invention.

The video signal processing apparatus of FIG. 1 illustrates a preferred application of the principles of the invention for converting a composite video signal of a standard format to one of the previously mentioned buried subcarrier format proposed by Pritchard and produces a frequency modulated picture carrier wave output signal suitable for recording on bandwidth limited media such as video discs or tapes or for transmission through other relatively narrow band transmission channels or media. For ease of illustration it is assumed that the composite video input signal is of NTSC format. The principles of the invention are readily adaptable, however, to other video standards such as PAL or SECAM by appropriate modification of the chrominance conversion portion of the apparatus and suitable selection of parameters such as delay line lengths, filter bandwidths, clipping reference levels, etc., to conform to the desired standard.

The composite video signal is applied to an input terminal 10 and separated into luminance and chrominance components by means of complementary comb filtering. The comb filter comprises a delay line 12 which delays the composite signal by one line interval (e.g., about 64 microseconds in the NTSC standard), a subtraction circuit 14 which subtracts the delayed from the non-delayed signal and an addition circuit 16 which adds the delayed and non-delayed signals. As explained in detail in the aforementioned Pritchard patent, the process of adding the delayed and non-delayed composite video signal results in a comb filter characteristic for the luminance signal (produced at the output of adder circuit 16) which exhibits recurring peaks at multiples of the line frequency and recurring nulls or "troughs" at odd multiples of half the line frequency. Subtraction of the delayed and non-delayed signals results in a comb filter characteristic for the chrominance signal (and luminance components below the chrominance signal band) which is complementary (i.e., it exhibits recurring peaks at odd multiples of half the line frequency and nulls at multiples of the line frequency).

The purpose of separating the luminance and chrominance signals by means of comb filtering (rather than simple lowpass and high pass filtering) is to prepare troughs in the luminance signal for receiving the chrominance signal after translation of the chrominance signal to a lower frequency. Since the chrominance signal is comb filtered with a complementary characteristic it can be interleaved with the luminance signal without producing "crosstalk" by appropriate choice of the new chrominance subcarrier frequency.

The precise frequency of the new chrominance subcarrier is chosen to be offset from a multiple of the line frequency (fH) associated with the video signal by a fraction of the line frequency (preferably by fH/n, where n is a small integer greater than unity). A particularly advantageous offset choice is a half line frequency (fH/2) offset, although other offset choices may be appropriate under special circumstances (as for example, where a PAL form is chosen for the subcarrier, and a quarter line frequency—fH/4—offset is suitable). An illustrative subcarrier frequency choice incorporating an fH/2 offset is (195/2 fH (or approximately 1,534,091 Hz, hereinafter 1.53 MHz) when the apparatus of FIG. 1 is used for processing NTSC standard input signals.

Conversion of the chrominance signal from the NTSC subcarrier frequency (about 3.58 MHz) to the buried subcarrier frequency (1.53 MHz) is provided by applying the output of subtraction circuit 14 to a bandpass filter 18 which, illustratively, has a center frequency of 3.58 MHz and a bandwidth of about 1 MHz. Filter 18 thus rejects the lower frequency combed luminance components which are also produced at the output of subtraction circuit 14 and passes only the combed chrominance signal to a multiplier 20 where it is multiplied or "mixed" with a reference frequency produced by an oscillator 22. The reference frequency is selected to equal the sum of the NTSC color subcarrier frequency (3.58 MHz) and the desired buried subcarrier frequency (1.53 MHz) so that product signals are produced by multiplier 20 of 1.53 MHz and 8.69 MHz. The lower frequency product signal is passed to a chrominance clipping circuit 26 by means of a bandpass filter having a passband centered at 1.53 MHz.

The output of the chrominance clipper circuit 26 is applied to a summing circuit 28 where it is combined with a preemphasized luminance signal that has been processed in accordance with the principles of the invention. The resultant composite buried subcarrier format video signal is then applied via a lowpass filter 30 to the input of a frequency modulator 32 which produces a frequency modulated picture carrier wave output signal. Since, as will be explained, the luminance signal is also clipped, the composite signal produced at the output of summing circuit 28 is confined to predetermined limits thereby preventing excessive frequency deviation of modulator 32. The purpose of lowpass filter 30 (which, illustratively, may have a cutoff frequency equal to or somewhat higher than the highest luminance signal frequency, e.g., 3 MHz or so) is to prevent the high frequencies that are produced when the luminance or chrominance signals exceed the clipping thresholds from reaching modulator 32.

As an alternative to clipping the chrominance signal prior to summation with the preemphasized luminance signal, clipper circuit 26 may be deleted and the composite signal may be clipped by interposing a clipping circuit between the output of summing circuit 28 and lowpass filter 30. Such an arrangement is shown and described in U.S. Pat. No. 4,096,513 which issued to M. D. Ross on June 20, 1978. If this is done the composite signal clipping circuit should have clipping levels beyond those of the clipping circuit in the luminance signal channel. As explained by Ross, clipping of the luminance signal followed by clipping of the composite signal advantageously eliminates the problem of a serrated appearance of the vertical edges of images processed by systems in which only the composite signal is clipped prior to frequency modulation of the FM carrier wave. The double clipping arrangement of FIG. 1 provides a similar advantage but allows individual settings of the luminance and chrominance clipping levels.

The combed luminance signal produced at the output of adder circuit 16 is processed and applied to the input of summing circuit 28 by means of a cascade connection of elements including, in the order named, a linear phase lowpass filter 40, a transversal peaking filter 42, a delay line 44, a summing circuit 46, a clamp circuit 48, a delay line 50, a lead/lag network 52 and an interactive clipper circuit 54. A further linear phase lowpass filter 56 is coupled between the output of subtraction circuit 14 and an input of summing circuit 46 in the cascade connection.

Lowpass filter 40 is of a type exhibiting a substantially constant delay (whereby the phase shift introduced by the filter varies linearly with frequency), and preferably is of a type exhibiting an impulse response approximating that of a sine squared function. Peaking filter 42 is chosen to be a linear phase transversal filter. By this means the energy of relatively rapid luminance transitions tends to be spread or evenly distributed about the transition region rather than concentrated or peaked as in the case with conventional lead-lag preemphasis networks. It is this process of redistribution of the energy of a luminance transient which minimizes luminance overshoots and enables one to extend the luminance preemphasis characteristic (as will be described) to higher frequencies within the luminance band yet maintain the signal amplitude within the linear range of clipping circuit 54 thereby enhancing the luminance signal-to-noise ratio and minimizing clipping distortion.

Networks having a linear phase characteristic and a sine squared impulse response are known. See, for example, "The Synthesis Of A Network To Have A Sine-Squared Impulse Response" by W. E. Thompson, Proc. IEE (London), Vol. 99, part III, p373 et.seq., 1973. See also "A New Sine-Squared Pulse And Bar Shaping Network" by A. Kastelein, IEEE Transactions On Broadcasting, Vol. BC-16, No. 4, p84 et.seq., Dec. 1970.

The amplitude response of conventional sine squared impulse response filter networks, such as those proposed by Thompson and Kastelein, exhibits a relatively gradual rolloff to and beyond what may be considered band edge. In order to extend the luminance preemphasis to the higher frequency end of the luminance signal band (e.g., 3 MHz in the example of FIG. 1) such a falling amplitude characteristic is undesirable.

What is needed is a lowpass filter which exhibits constant delay, a sine squared impulse response and an amplitude response which increases with frequency to about the upper end of luminance band and then rapidly decreases. A particularly desirable amplitude response is one which varies logarithmically with frequency through the luminance band. A preferred relationship is one in which the amplitude, A, of the filter response, when expressed in decibels (dB) is proportional to the square of the luminance band frequency when expressed in mega hertz (MHz) as follows:

$$A(dB) \simeq Kf^2(MHz) \qquad (1)$$

over the range:

$$0 < f < Be \qquad (2)$$

In expression (2) the term Be may be the luminance band edge frequency (e.g., 3MHz) or may be somewhat less. A preferred value of K is unity.

In FIG. 1 a filter having the above mentioned phase, impulse response and amplitude response characteristic is implemented by the connection of a transversal peaking filter 42 in cascade with filter 40. To achieve the desired overall amplitude response (expression 1 and 2, supra) the transversal filter includes a delay element selected such that the filter output exhibits a peak near band edge (3 MHz). The transversal filter gain is set to provide an amplitude response for the combination of filters 40 and 42 satisfying the aforementioned expressions.

Figure 2:
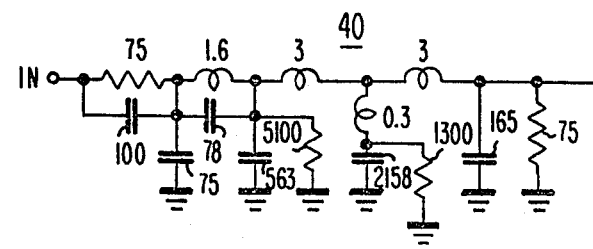
FIG. 2 is a circuit diagram of a preferred linear phase lowpass filter and transversal peaking filter suitable for use in the main luminance preemphasis path of the apparatus of FIG. 1.
Figure 2:
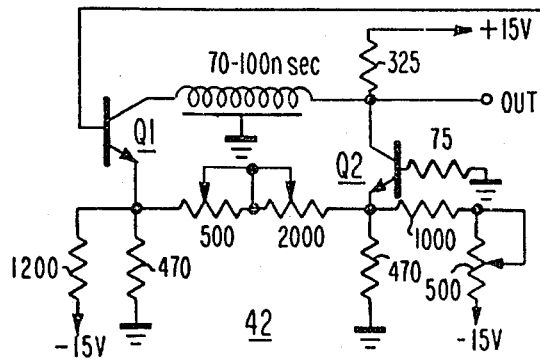

FIG. 2 provides a specific example of how filters 40 and 42 may be implemented to provide the composite filter function. Resistance values are expressed in Ohms, capacitance values are expressed in pico-Farads and inductance values are expressed in milli-Henrys. The order of the cascade connection may be reversed if desired. If this is done transistor Q1 should be driven from a source having an output impedance of 75 ohms (i.e., the same as provided for applying base bias to Q2) so as to preserve balance and the collector of Q2 should be buffered (e.g., by an emitter follower) to provide a suitable driving source impedance for filter 40 (filter 40 is designed to be driven and terminated by 75 ohm source and load impedances).

The 500 ohm potentiometer in the emitter bias circuit of Q2 should initially be set to about 200 ohms and then adjusted such that Q1 and Q2 are balanced (i.e., have substantially equal collector currents). The coarse and fine emitter coupling potentiometers (2000 ohms and 500 ohms, respectively) should be adjusted such that the amplitude response of the cascade connection of filters 40 and 42 satisfies expressions 1 and 2, supra.

Returning to FIG. 1, linear phase luminance preemphasis is also performed in an auxiliary path coupled to a point (e.g, summing circuit 46) in the principle luminance processing path (40–54). The auxiliary path comprises the connection of lowpass filter 56 between the output of subtraction circuit 14 and an input of summing circuit 46. Filter 56 is selected to have a linear phase (constant delay) characteristic and an amplitude response which extends to about the lowest buried subcarrier chrominance signal frequency. For the illustrated system, a suitable choice would be about 1 MHz for a 1.53 MHz buried subcarrier frequency choice which has sidebands extending ±500 KHz thereabout.

Preferably, filter 56 is of a type exhibiting a sine squared impulse response for providing a uniform distribution of relatively low frequency luminance transient energy. A suitable circuit design for filter 56 is given in FIG. 3 which, like filter 40 of FIG. 2, is also designed for 75 ohm source and termination impedances. As in FIG. 2, all circuit values are expressed in milli-Henrys, pico-Farads and Ohms.

The purpose of the auxilliary luminance path is to augment or replace lower frequency luminance components which were "combed" or removed from the luminance signal appearing at the output of addition circuit 16. From the previous discussion, the comb filter characteristic at the output of subtraction circuit 14 is complementary to that produced at the output of addition circuit 16. Accordingly, when the 0–3 MHz luminance signal produced by circuit 16 is summed in summing circuit 46 with the 0–1 MHz luminance signal produced by subtraction circuit 14 and filtered by filter 56, the composite luminance signal is essentially uncombed up to 1 MHz and combed in the 1–3 MHz region for receiving the down converted buried subcarrier luminance signal. This filling in of the luminance spectrum below 1 MHz advantageously replaces information representative of the vertical detail of the picture signal.

Figure 3:
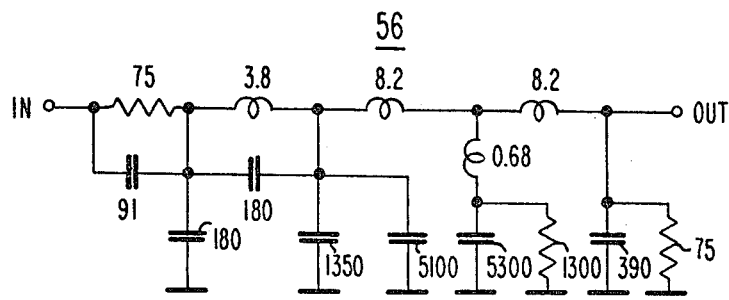
FIG. 3 is a circuit diagram of a preferred linear phase lowpass filter suitable for use in the auxiliary luminance preemphasis path of the apparatus of FIG. 1.

The purpose of delay element 44 (e.g., a delay line) is to provide compensation for the different luminance signal delay times through the path including filters 40 and 42 and the path including filter 56. A delay difference results because of the different bandwidths of the filters. For the filters illustrated in FIG. 2, the delay through each of filters 40 and 42 is about 100 nSec. In FIG. 3 the delay of lowpass filter 56 is about 500 nSec. Accordingly, to equalize luminance delay up to summing circuit 46, delay element 44 should be set to equal the delay difference in the two paths (e.g., 300 nSec).

In order that interactive clipper circuit 54 may set precise boundaries for the luminance signal relative to conventional transmission levels, the luminance signal produced at the output of circuit 46 is periodically clamped to a d.c. reference level by means of clamp circuit 48 which receives a line frequency input signal fH for timing purposes. Suitable clamping or "d.c. restoration" circuits are well known. Expressed in terms of IRE units (where maximum picture white level prior to preemphasis is +100 units, sync pedestal is 1 unit and sync tip is −40 units) clamp circuit 48 may be set to clamp the "back porch" region of the horizontal synchronizing pulse to a level of about 1 unit. A suitable choice of clipping levels for the luminance clipper circuit 54 is +140 and −66 IRE units.

Additional delay equalization is provided in the luminance processing signal path by means of delay element 50 coupled to the output of clamp circuit 48. The purpose of the delay is to provide further delay in the luminance path which, in combination with the 500 nSec. of delay up to summing circuit 46 equals the sum of the delays of filters 18 and 24 in the chrominance converter (18-26). By this means it may be assured that the chrominance portion of the composite video output signal is in registration with the luminance portion of the signal. In the example given, the delays of the delays of the 1MHz band pass chrominance filters 18 and 24 total about 1000 nSec. Since the luminance signal receives a delay on the order of 500 Sec up to summing circuit 46, delay element 50 should be selected to provide an additional 500 nSec of delay. Since, as a practical matter, the actual filter delays may differ somewhat from the desired values it is preferable that element 50 be variable (e.g., a tapped delay line). Since element 50 operates upon the summed "vertical detail" and broad band luminance signal, the delay of each changes with the settings of element 50. This provides an advantage in that only a single control element need be adjusted to achieve correct luminance and chrominance registration.

The output of delay element 50 is applied to a lead-lag type of preemphasis network 52 and clipped by means of an interactive clipper circuit 54 prior to summation with the buried subcarrier chrominance signal in summing circuit 28. Network 52 is of a type having a non-linear phase characteristic and an amplitude response characteristic which increase by a predetermined amount over a lower portion of the luminance signal frequency band and assumes a substantially constant level over an upper portion of the luminance signal frequency band. For the system under consideration, an illustrative choice of a lead and lag break frequencies is 0.25 MHz and 1.0 MHz, respectively.

Figure 4:
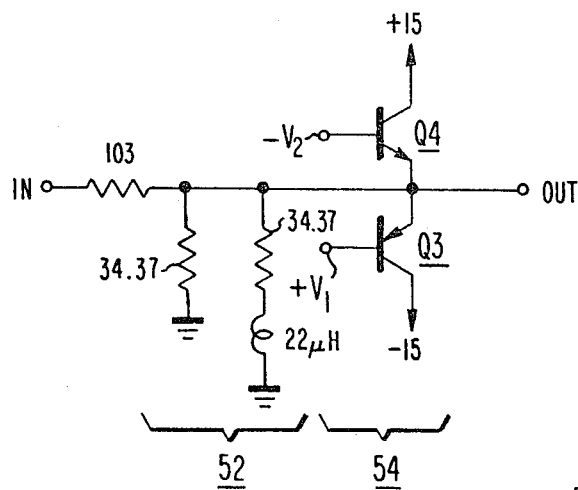
FIG. 4 is a circuit diagram of a preferred lead-lag network and interactive clipping circuit suitable for use in the apparatus of FIG. 1.

Network 52 may comprise a resistance-capacitance network such as that shown in the aforementioned Ross U.S. Pat. No. (4,096,513) or a resistance inductance network such as that shown in the U.S. Patent Application of T. J. Christopher, Ser. No. 20,334 filed Mar. 14, 1979 which was abandoned in favor of a continuing application which issued Dec. 15, 1981, as U.S. Pat. No. 4,203,256. FIG. 4 herein provides a preferred implementation of a resistance-inductance network which has a lead break point of 0.25 MHz, a lag break point of 1.0 MHz, a slope of 6 dB/Octave, a two octave spread and which provides a net 12 dB of boost to high frequency luminance signal components.

Clipper circuit 54 is referred to herein as an "interactive" clipper to signify that, when activated, it modifies the characteristics of lead-lag network 52 in accordance with the teachings of Christopher in has aforementioned patent application. Specifically, circuit 54 comprises diodes directly coupled to the resistance-inductance lead-leg network 52 which, when forward biased by a luminance signal of clipping level, changes the network 52 time constant such that the clipped signal is "stretched". As explained in detail in the Christopher application, the maintenance of clipping beyond the time it would normally terminate provides reduction of clipping distortion by, in effect, replacing a portion of luminance signal energy lost through conventional clipping with additional pulse energy provided by stretching or prolonging the clipped waveform.

FIG. 4 provides a preferred implementation of the interactive clipper circuit proposed by Christopher wherein the clipping diodes are implemented by means of transistor base emitter junctions and wherein each transistor (Q3, Q4) operates in a common base configuration with reference voltages applied to their respective base electrodes for setting the luminance clipping levels. As an alternative, clipper circuit 54 may be of the non-interactive type as shown in the Ross U.S. Pat. No. 4,096,513 in which case the lead-lag network may be either of the resistance-capacitance type (also shown in Ross) or of the resistance-inductance type, (shown in the Christopher application and FIG. 4 herein).

Various other changes and modifications may be made to the video processing apparatus of FIG. 1 without departure from the spirit and scope of the invention. As previously mentioned, the composite signal may be clipped by interposing a clipping circuit between elements 28 and 30 and clipper circuit 26 may be retained or removed. Also, the order of various cascaded elements may be interchanged. For example, elements 40, 42 and 44 may be in any order. Delay element 50 may proceed or follow clamp circuit 48.

Figure 5:
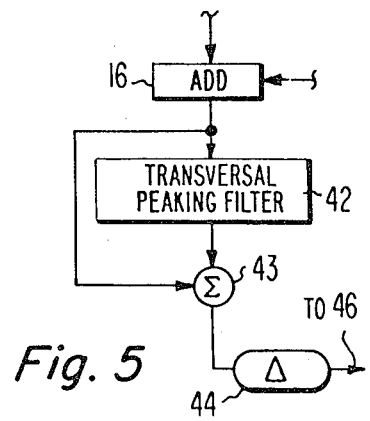
FIG. 5 is a block diagram illustrating a modification of the apparatus of FIG. 1.

A further change, as shown in FIG. 5, is that filter 40 may be omitted and linear phase preemphasis can be added to the upper portion (1-3 MHz) of the luminance band by applying the output of addition circuit 16 directly to the input of filter 42 and summing the filter 42 input and output signals in a summing circuit 43. The output of circuit 43 is then applied to delay element 44. Since removal of filter 40 necessarily decreases the delay in the luminance path between circuits 16 and 46, the delay of element 44 should be increased appropriately to match the delay between circuits 14 and 46 thereby maintaining proper registration of the luminance signals in the two paths.

Figure 6:
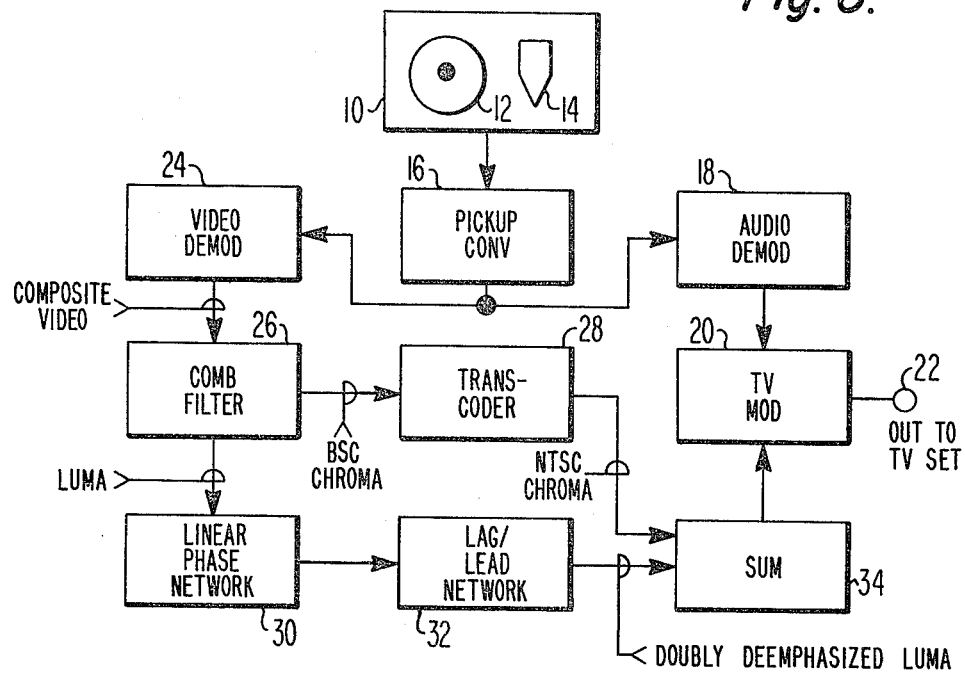
FIGS. 6 and 7 are block diagrams of video disc players embodying the invention.

The video disc player of FIG. 6 illustrates a preferred arrangement for imparting a deemphasis characteristic to a luminance signal which is essentially complementary to the hereinbefore described preemphasis characteristic. The video disc player includes a player mechanism 10 having a turntable for rotating a video disc record 12 at a constant angular velocity and a pickup transducer 14 for recovering information signals from the disc. Illustratively, it will be assumed that the player is intended for use with records in which information is stored in the form of topological variations and recovered by sensing capacitance variations between pickup transducer 14 and the record 12. The output of transducer 14 is coupled to the input of a pickup converter 16 which comprises a capacitance-to-voltage converter responsive to capacitance variations between a stylus in transducer 14 and the record being played for producing an FM output signal voltage representative of the recorded information.

Such records and suitable circuits for implementing the capacitance-to-voltage conversion function of pickup converter 16 are well known. See, for example, U.S. Pat. No. 3,783,196 entitled "HIGH-DENSITY CAPACITIVE INFORMATION RECORDS AND PLAYBACK APPARATUS THEREFOR" which issued to T. O. Stanley, Jan. 1, 1974; U.S. Pat. No. 3,972,064 entitled "APPARATUS AND METHODS FOR PLAYBACK OF COLOR PICTURES/SOUND RECORDS" which issued to E. O. Keizer, July 27, 1976; and U.S. Pat. No. 3,711,641 entitled "VELOCITY ADJUSTING SYSTEM" which issued to R. C. Palmer, Jan. 16, 1973.

The output of converter 16 is applied to the input of an audio FM demodulator 18 which demodulates the audio FM portion of the recovered signal to baseband.

The baseband audio signal is applied to the sound carrier modulation input of a TV modulator 20 which has an output terminal 22 for connection to the antenna terminals of a conventional television receiver. The video portion of the recovered signal is processed as will be described and applied to the baseband video input terminal of modulator 20 which produces video and sound carriers on a selected TV channel for reception by the television receiver. An integrated circuit suitable for use as TV modulator 20 and which may be selectively operated to produce output signals on channels 3 or 4, for example, is the model LM1889N "TV VIDEO MODULATOR" made by National Semiconductor Company, Inc.

Video FM demodulator circuit 24 converts the video FM signal produced by pickup circuit 16 to a baseband video output signal. For purposes of illustrating certain features of the invention, it will be assumed that the video signals recorded on the disc are in the previously mentioned "buried subcarrier" (BSC) format proposed by Pritchard. FM demodulator 24 (and also audio demodulator 18) illustratively may be of the pulse counting type or of the phase-lock-loop (PLL) type. A suitable pulse counting type FM demodulator is disclosed in U.S. Pat. No. 4,038,686 entitled "DEFECT DETECTION AND COMPENSATION" which issued to A. L. Baker July 26, 1977. An FM demodulator of the phase-lock-loop type is described in U.S. Patent Application, Ser. No. 948,013 of T. J. Christopher et al., entitled "FM SIGNAL DEMODULATOR WITH DEFECT DETECTION" which was filed October 2, 1978 and which issued May 13, 1980, as U.S. Pat. No. 4,203,134.

The composite video signal produced by demodulator 24 is separated into a buried subcarrier (BSC) chrominance component and a luminance component by means of filter 26 which, preferably, in a comb filter. A suitable comb filter is described in U.S. Pat. No. 3,996,606. A preferred filter is described in the U.S. Patent Application of T. J. Christopher and L. L. Tretter entitled "VIDEO PROCESSING SYSTEM INCLUDING COMB FILTERS" Ser. No. 966,512 filed Dec. 4, 1978 and which issued Mar. 25, 1980, as U.S. Pat. No. 4,195,309. Another example is disclosed in U.S. Pat. No. 3,996,610 entitled "COMB FILTER APPARATUS FOR VIDEO PLAYBACK SYSTEMS" which issued Dec. 7, 1976, to H. Kawamoto.

The chrominance signal produced by filter 26 is converted from buried subcarrier format (e.g., 1.53 MHz) to NTSC format (e.g., 3.58 MHz) means of chrominance transcoder 28. The luminance signal produced by filter 26 is deemphasized by a cascade connection of two networks 30 and 32, as will be described in detail subsequently. The resultant doubly deemphasized luminance signal is then combined with the transcoded chrominance signal by means of a summing circuit 34 and the resultant NTSC standard composite video signal is then applied to the video input terminal of modulator 20, as previously mentioned, to provide modulated picture and sound carrier waves to terminal 22.

Transcoder 28, preferably, is of the color burst locked heterodyne conversion kind as disclosed, for example, in U.S. Pat. No. 3,965,482 entitled "VELOCITY CORRECTION CIRCUIT FOR VIDEO DISCS" which issued to T. W. Burrus, June 22, 1976. The processor includes color burst error detection circuitry for varying the frequency of a heterodyne conversion oscillator in a sense to minimize chrominance signal timebase errors. Another suitable implementation of transcoder 28 for NTSC standard players is disclosed in the U.S. Patent Application of G. D. Pyles, J. A. Wilber and T. J. Christopher entitled "FAST RECOVERY SQUELCH CIRCUIT FOR A VIDEO DISC PLAYER" Ser. No. 068,015 filed Aug. 20, 1979 and which issued Aug. 25, 1981, as U.S. Pat. No. 4,286,290. A suitable implementation of transcoder 28 for PAL standard players is disclosed in the U.S. Patent Application of J. G. Amery entitled "CHROMINANCE TRANSCODER" Ser. No. 154,579 filed May 29, 1980 and which issued Feb. 2, 1980, as U.S. Pat. No. 4,314,273.

Network 30 is a lowpass filter of a type exhibiting a substantially constant delay (whereby the phase shift varies linearly with frequency). Networks having such a linear phase characteristic (such as the previously mentioned Thompson and Kastelein networks) are known. For higher order Gaussian networks the constant delay property extends well into the stop band. A preferred amplitude response or pass band characteristic is one in which the filter attenuation (expressed in decibels) varies in proportion to the square of frequency (expressed in megahertz) up to what may be considered the luminance band edge (e.g., about 3 MHz in this example).

Network 32 is a lag-lead network having a non-linear phase characteristic and an amplitude response which decreases by a predetermined amount over the lower portion of the luminance signal band. Illustratively, such a network may be of the resistance-inductance or resistance-capacitance type and, for the NTSC standard player of FIG. 6, preferably would have a lag breakpoint at about 0.25 MHz (0.64 microsecond time constant) and a lead breakpoint of about 1.0 MHz (0.16 microsecond time constant) and a slope in the transition region of about 6 dB/octave thereby providing a maximum attenuation of about 12 dB. This characteristic is the complement of that of the previously described network 52.

The combination of networks 30 and 32, being connected in a common signal path and having the above noted relative amplitude response characteristics, exhibits a frequency dependent variation which is dominated by the lag-lead network 32 over the lower portion (e.g., 0-3 MHz) and dominated by the linear phase network 30 over the upper portion (e.g, 1-3 MHz) of the luminance signal frequency band. This combination offers an advantage in that substantial amounts of deemphasis may be imparted to the luminance signal throughout its bandwidth without degrading the transient response of the player or requiring the use of relatively complex networks. This results because the luminance signal components most critical to good transient response are the higher frequency components and although the phase response of network 32 is non-linear in its transition region (0.25 to 1.0 MHz) it approaches a linear relationship with frequency above the lead break point (1.0 MHz). It is in this higher frequency region (e.g., 1.0 to 3.0 MHz) that network 30 becomes dominant thereby continuing the deemphasis of the luminance signal and since the phase response characteristics of the combination of networks is substantially linear in this region the luminance signal transient response is improved.

Figure 7:
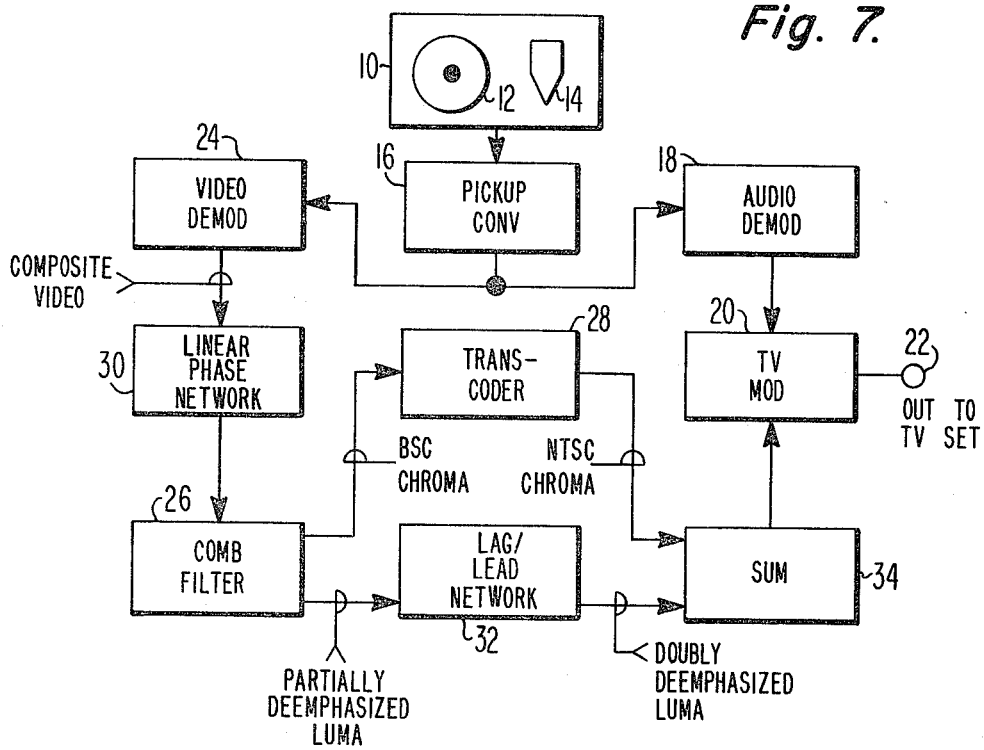

The video disc player of FIG. 7 is similar to that of FIG. 6 but differs in that network 30 is interposed between the output of demodulator 24 and the input of comb filter 26. The principal effect of this change is an alteration of the relative amplitudes of the upper and lower sidebands of the chrominance signal. Specifically, for the assumed chrominance subcarrier signal frequency of 1.53 MHz and bandwidth of 1.0 MHz the lower sideband will extend to about 1.03 MHz and the upper sideband will extend to about 2.03 MHz. Thus, for the assumed attenuation characteristic of network 30, the attenuation of the chrominance signal will be 1.0 dB at 1 MHz and 4.0 dB at 2 MHz. As a result, placing network 30 before the comb filter will, for the assumed conditions, result in a variation of about 3 dB of the chrominance signal from one extreme of its frequency band to the other.

In the event that the chrominance signal is not predistorted in a complementary fashion during the recording of record 12, the amplitude variation of the chrominance signal may be minimized by interposing a 3 dB amplitude equalizer between the chrominance signal output of filter 26 and the input of transcoder 28. Alternatively, chrominance signal amplitude equalization may be effected subsequent to transcoding.

Figure 8:
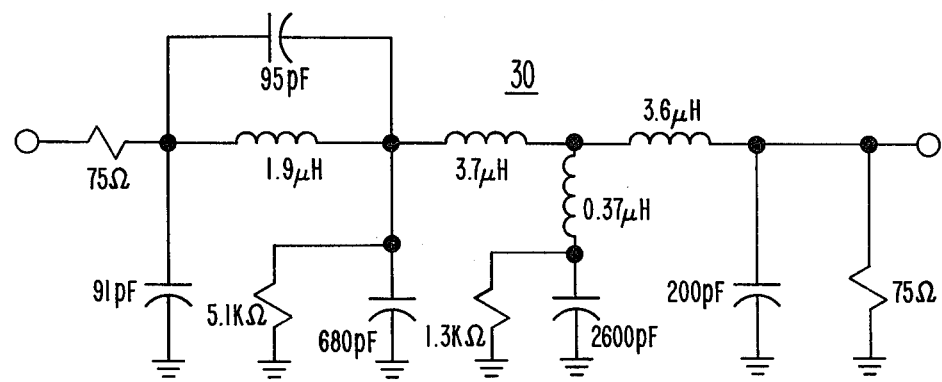
FIGS. 8 and 9 are circuit diagrams of deemphasis networks suitable for use in the video disc players of FIGS. 6 or 7.
Figure 9:
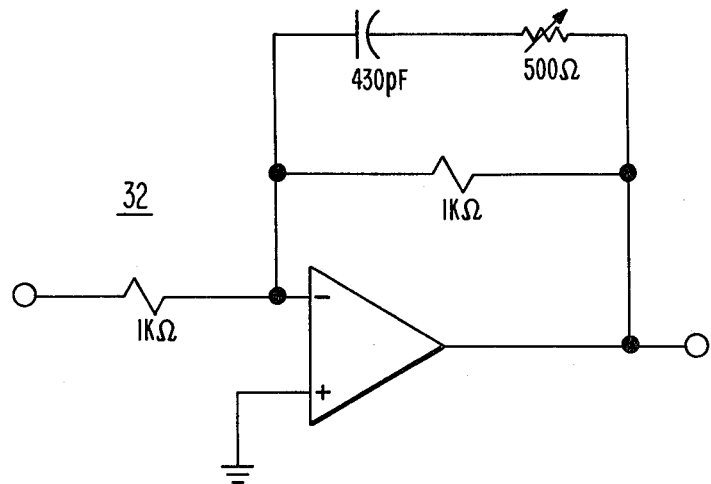

FIGS. 8 and 9 provide specific examples of networks 30 and 32, respectively, suitable for use in the video disc players of FIG. 6 or 7. The linear phase deemphasis network 30 of FIG. 8 is a lowpass filter derived from a prototype of the previously mentioned Thompson filter class. The filter is designed for 75 ohm source and termination impedances and, for the element values shown, provide an attenuation characteristic, expressed in dB, proportional to the square of frequency, expressed in megahertz. In network 32 the resistance-capacitance values of the feedback network of an operational amplifier are selected to provide lag-lead time constants of 0.64 and 0.16 microseconds, respectively, (the 500 ohm potentiometer is provided for precise adjustment of the attenuation characteristic). The combination of the attenuation characteristics of networks 30 and 32 assures that the overall amplitude response exhibits a frequency dependent variation (attenuation) dominated by network 32 over the lower portion of the luminance band and dominated by network 30 over the upper portion of the luminance band.

What is claimed is:

1. In a video disc player of the type comprising signal recovery means for rotating a video disc record and producing a composite video signal, filter means for separating the composite video signal into a chrominance component and a luminance component, transcoder means for translating the chrominance component from a first to a second frequency range, combining means for combining the luminance component and frequency translated chrominance component to form a resultant composite video signal, the improvement, comprising:

first deemphasis network means of a type having a non-linear phase characteristic and having an amplitude response characteristic which decreases by a predetermined amount over a lower portion of the frequency band of said luminance signal component and assumes a substantially constant level over an upper portion of said frequency band;

second deemphasis network means of a type having a linear phase characteristic and an amplitude response characteristic which decreases throughout said upper porton of said frequency band; and circuit means for interposing said second deemphasis network means in a first circuit path between said signal recovery means and said filter means and for interposing said first deemphasis network means in a second circuit path between a luminance signal output point of said filter means and an input of said combining means.

2. A video disc player as recited in claim 1 wherein:

said first deemphasis network means comprises a lag-lead network of a type having first and second time constants, the ratio of said time constants being substantially equal to four-to-one; and wherein said second deemphasis network means comprises lowpass filter means of a type having an attenuation characteristic which, when expressed in decibels, is proportional to the square of frequency, expressed in megahertz.

3. In video signal processing apparatus wherein carrier frequency waves are subject to frequency modulation by a luminance signal and which includes a preemphasis network for subjecting the luminance signal to high frequency preemphasis and signal clipping means for confining the preemphasized luminance signal excursions to a selected range of values, said preemphasis network having a non-linear phase characteristic and having an amplitude response characteristic which increases by a predetermined amount over a lower portion of the luminance signal frequency band and assumes a substantially constant level over an upper portion of said luminance signal frequency band, the improvement comprising:

a second preemphasis network having an amplitude response which increases throughout said upper portion of said luminance signal frequency band, said second preemphasis network being of a type exhibiting a substantially linear phase characteristic;

circuit means for coupling said preemphasis networks in a cascade connection for doubly preemphasizing said luminance signal prior to application thereof to said signal clipping means, the relative amplitude response characteristics of said networks being selected in a predetermined relationship such that the amplitude response of the cascade connection exhibits a frequency dependent variation dominated by the first mentioned network over said lower portion of said luminance band and dominated by said second network over said upper portion of said luminance band, whereby said luminance signal receives an increase in preemphasis over both portions of its bandwidth and clipping distortion under transient signal conditions is reduced.

4. A video signal processing apparatus as recited in claim 3 wherein:

said first preemphasis network comprises a lead-lag network; and said second preemphasis network comprises a cascade connection of a filter of a first type and a filter of a second type.

5. A video signal processing apparatus as recited in claim 4 wherein:

said filter of said first type comprises a lowpass filter having a passband which extends to and substantially includes said upper portion of said luminance signal frequency band and wherein:

said filter of said second type comprises a peaking filter having an amplitude response maxima located within said upper portion of said luminance signal frequency band.

6. A video signal processing apparatus as recited in claim 5 wherein said peaking filter comprises a transversal filter having a substantially constant delay.

7. A video signal processing apparatus as recited in claim 6 further comprising adjusting means in said transversal filter for controlling the amplitude response thereof such that said cascade connection of said filters of said first and second types exhibits a rising amplitude response throughout said lower and upper portions of said luminance signal frequency band.

8. A video signal processing apparatus as recited in claim 7 wherein said adjusting means is adjusted such that said second preemphasis network exhibits an amplitude response within said upper and lower portions of said luminance signal frequency band that is porportional to the logarithm of the luminance frequency.

9. A video signal processing apparatus as recited in claim 7 wherein said adjusting means is adjusted such that said second preemphasis network exhibits an amplitude response which, when expressed in decibels, is proportional to the square of the frequency of said luminance signal, when expressed megahertz.

10. A video signal processing apparatus as recited in claim 3 wherein said circuit means comprises:
first means for applying said luminance signal to an input port of said second preemphasis network;
second means for coupling an output port of said second preemphasis network to an input port of said first preemphasis network;
third means for coupling an output port of said first preemphasis network to an input port of said signal clipping means; and
means for deriving an output signal from said signal clipping means for controlling a frequency modulator.

11. A video signal processing apparatus as recited in claim 10 wherein said first means comprises:
comb filter means having an input for initially receiving said luminance signal, having a first output for providing a first combed output signal and having a second output for providing a second combed output signal; and
means for applying said first combed output signal to said input port of said second preemphasis network.

12. A video signal processing apparatus as recited in claim 11 further comprising:
lowpass filter means having a substantially linear phase characteristic and a stop band extending to said upper portion of said luminance signal frequency band;
means for applying said second combed output signal to an input port of said lowpass filter means; and
means for deriving an output signal from said lowpass filter means and for applying the derived output signal to a point in said cascade connection.

13. A video signal processing apparatus as recited in claim 3 further comprising:
comb filter means having an input for receiving a composite video input signal and two outputs;
signal summing means having two inputs and an output;
means coupling said second preemphasis network between one output of said comb filter means and one input of said signal summing means;
a lowpass filter having a linear phase characteristic;
means coupling said lowpass filter between the other output of said comb filter means and the other input of said signal summing means;
means coupling said output of said signal summing means to an input of the first mentioned preemphasis network; and
delay means coupled in cascade connection with said second preemphasis network for introducing a signal delay of predetermined amount such that substantially equal delays are experienced by luminance signal components passed by said lowpass filter and by said second preemphasis network to said signal summing means.

14. A video signal processing apparatus as recited in claim 3 wherein said second preemphasis network includes a lowpass filter of a type having a sine squared impulse response.

15. A video signal processing apparatus as recited in claim 3 wherein said second preemphasis network comprises a transversal peaking filter and means for summing an input luminance signal supplied to the transversal filter with an output luminance signal produced by the transversal filter to produce a sum signal having an amplitude response peaked within said upper portion of said luminance signal frequency band and which exhibits a substantially linear phase characteristic.

* * * * *